United States Patent
Lippert et al.

(10) Patent No.: US 8,778,782 B2
(45) Date of Patent: Jul. 15, 2014

(54) FABRICATION OF GRAPHENE ELECTRONIC DEVICES USING STEP SURFACE CONTOUR

(75) Inventors: Gunther Lippert, Frankfurt (DE); Jaroslaw Dabrowski, Frankfurt (DE); Grzegorz Lupina, Berlin (DE); Olaf Seifarth, Burghausen (DE)

(73) Assignee: IHP GmbH—Innovations for High Performance Microelectronics, Frankfurt (DE)

( * ) Notice: Subject to any disclaimer, the term of this patent is extended or adjusted under 35 U.S.C. 154(b) by 0 days.

(21) Appl. No.: 13/306,031

(22) Filed: Nov. 29, 2011

(65) Prior Publication Data

US 2012/0132885 A1   May 31, 2012

(30) Foreign Application Priority Data

Nov. 29, 2010 (EP) .................................. 10192982
Aug. 12, 2011 (EP) .................................. 11177483

(51) Int. Cl.
  *H01L 21/36* (2006.01)
(52) U.S. Cl.
  USPC ............... 438/478; 438/489; 438/490; 257/9; 257/E21.09; 257/E29.104
(58) Field of Classification Search
  USPC ......... 257/9, 77, E29.104; 438/478, 489, 490
  See application file for complete search history.

(56) References Cited

U.S. PATENT DOCUMENTS

| | | |
|---|---|---|
| 5,389,798 A | 2/1995 | Ochi et al. |
| 2005/0212014 A1 | 9/2005 | Horibe et al. |
| 2008/0246023 A1 | 10/2008 | Zeng et al. |
| 2009/0235721 A1 | 9/2009 | Robinson et al. |
| 2010/0028681 A1 | 2/2010 | Dai et al. |
| 2010/0035186 A1 | 2/2010 | Hong et al. |
| 2010/0059863 A1 | 3/2010 | Rogers et al. |
| 2011/0017979 A1 | 1/2011 | Meric et al. |
| 2011/0042687 A1* | 2/2011 | Chu et al. .................... 257/77 |
| 2011/0175060 A1 | 7/2011 | Okai et al. |
| 2012/0258587 A1* | 10/2012 | Kub et al. ................ 438/610 |

FOREIGN PATENT DOCUMENTS

| | | |
|---|---|---|
| CN | 102097297 | 6/2011 |
| DE | 102008055100 | 7/2010 |
| WO | WO 2010/036210 | 4/2010 |
| WO | WO 2011/105530 | 9/2011 |

OTHER PUBLICATIONS

Victor Ryzhii, et al; "Thermionic and tunneling transport mechanisms in grapheme field-effect transistors"; May 28, 2008; 2008 Wiley-VCH Verlag GmbH & Co. KGaA, Weinheim; phys. Stat. sol. (a) 205, No. 7; pp. 1527-1533.

Qin Zhang, et al; "Graphene Nanoribbon Tunnel Transistors"; Nov. 21, 2008; IEEE Electron Device Letters; pp. 1-3.

* cited by examiner

*Primary Examiner* — Elias M Ullah

(57) ABSTRACT

A method for fabricating an electronic component, comprising providing a substrate; and depositing a graphene layer; wherein the substrate is either provided with a van-der-Waals functional layer or a van-der-Waals functional layer is deposited on the substrate before depositing the graphene layer; a surface step contour is formed; and growth of the graphene layer is seeded at the step contour.

15 Claims, 12 Drawing Sheets

(A)

(B)

(C)

FABRICATION OF GRAPHENE ELECTRONIC DEVICES USING STEP SURFACE CONTOUR

CROSS REFERENCE TO RELATED APPLICATION

Reference is made to and priority claimed from European Patent Application Serial Nos. 10 192 982.6, filed Nov. 29, 2010, entitled METHOD OF PRODUCING AN ELECTRONIC COMPONENT, ELECTRONIC COMPONENT AND ELECTRONIC DEVICE and 11 177 483.2, filed Aug. 12, 2011, entitled FABRICATION OF GRAPHENE ELECTRONIC DEVICES USING STEP SURFACE CONTOUR.

BACKGROUND OF THE INVENTION

1. Technical Field

The invention relates to an electronic component comprising a graphene layer and to a method of producing an electronic component comprising a graphene layer. The invention also relates to an electronic device.

2. Discussion of Related Art

An electronic component is typically fabricated using semiconductor materials and is hereinafter is also referred to as a semiconductor component with the same meaning.

Graphene is a 2D crystal of $sp^2$-bonded carbon atoms in a honeycomb lattice. In general, layered stacks of graphene form common graphite, but films with only few carbon layers have to be considered as different type of 2D crystals or "graphene". One of the outstanding properties of graphene, particularly with one or two layers, is a high charge carrier mobility, which could be employed to revolutionize high-frequency microelectronics. Other potential applications include optoelectronics and chemical sensors.

Graphene can be exfoliated from graphite, grown on a metal substrate and transferred to the target wafer or grown epitaxially on silicon carbide (SiC). Even though the two latter schemes have potential for mass production, there are severe technological shortcomings. Growth on metal requires subsequent mechanical transfer onto desired substrates and hence is not necessarily compatible with existing silicon processing technology. In addition, it raises environmental concerns, because a sacrificial metal film must be chemically dissolved, and the used chemicals—eventually disposed of. SiC wafers are limited in size and are quite expensive, and while it is possible to grow graphene epitaxially from SiC seeds deposited on Si, the required temperatures for either option are beyond typical silicon processes (>1000° C.).

Graphene deposition using plasma-enhanced chemical vapor deposition (PECVD) can meet stringent silicon technology requirements, but PECVD films grown on insulators are so far either thick (thicker than six carbon layers), strongly distorted, or do not grow parallel to the substrate.

DISCLOSURE OF INVENTION

A method of producing an electronic component according to the invention is also defined by claim 1. According to an aspect of the present invention, a method of producing an electronic component comprises:
 providing a substrate,
 depositing a graphene layer, wherein
 the substrate is either provided with a van-der-Waals functional layer or a van-der-Waals functional layer is deposited on the substrate before depositing the graphene layer,
 a surface step-contour is formed;
 a site of the step contour is used as a seed site for growth of the graphene layer connected to the seed site.

Providing a van-der-Waals functional layer allows carbon atoms to form a two-dimensional graphene layer directly on the van-der-Waals functional layer. The van-der-Waals functional layer provides that substantially only van-der-Waals like forces contribute to binding carbon atoms of the graphene layer to the van-der-Waals functional layer.

Van-der-Waals-like forces include the van-der-Waals-force itself but are not restricted to it. In some embodiments, the binding of the graphene layer to the van-der-Waals functional layer is due only to the van-der-Waals-force. However, in some other embodiments, the van-der-Waals-like binding force includes contributions of forces, which are weaker than a covalent force. Examples of such other force contributions are found in embodiments, in which electrostatic ionic forces or partially covalent forces contribute to the binding of the graphene layer to the van-der-Waals functional layer.

The van-der-Waals functional layer is in some embodiments made of a material for which—when applied using the method of the invention—a binding energy of graphene to the van-der-Waals functional layer E(C-Substrate) is lower than a covalent carbon-carbon binding energy E(C—C), i.e.:

$$[E(C\text{—}C)]/[E(C\text{-Substrate})] \geq 1$$

The substrate may be provided with a van-der-Waals functional layer. This embodiment includes an embodiment, in which the substrate as a whole represents the van-der-Waals functional layer. In another embodiment, a substrate is used that has a pre-fabricated van-der-Waals functional layer on it. Such substrates are often available on the market, for instance in the form of so-called epiwafers. In this case, the van-der-Waals functional layer forms a layer of a material different from the substrate material.

In an alternative embodiment, the van-der-Waals layer is deposited within the process of the invention.

A suitable material of a van-der-Waals functional layer is for instance a high-K dielectric material, that is, a material with a dielectric constant K in the range between K=3 to K=1000. The dielectric constant is also referred to in the art as the static relative permittivity, or as the relative dielectric constant. An alternative symbol that is commonly used for this material property is $\in_r$. Preferably, the van-der-Waals functional layer has an overall dielectric constant in this range of K=3 to K=400. A range of dielectric constants of K=3 to K=100 is particularly preferred for transistor applications.

Preferred materials that may be used to form the van-der-Waals functional layer include dielectric materials that are an oxide or a nitride or a silicide or a nitrate or a silicate of an element selected from an alkaline or an alkaline earth or a rare earth or a transition metal or mixtures thereof.

In particular an oxide or a nitride or a silicide or a nitrate or a silicate of an element selected from the group of Pr, Ce. Hf, Zr, Ti, Ba, Sr, Fe, Al, Mg, K or mixtures thereof turned out to be useful dielectric materials for the van-der-Waals functional layer. For instance, BN, $Ce_2O_3$, $CeO_2$ or $PrO_3$ or $HfO_2$ may be used. The alkaline or alkaline earth or rare earth or transition metals or the elements mentioned above can be provided in different oxidation states. Currently preferred dielectric materials include $BaHfTiO_3$, a La-Perovskite, a chalkogenide, or mixtures thereof. In a further preferred embodiment the van-der-Waals functional layer comprises or consists of $SiO_2$, $Si_3Ni_4$ or an aluminum silicate.

Chalcogenides are chemical compounds consisting of at least one chalcogen ion and at least one more electropositive element. All group 6 elements of the periodic table are defined as chalcogen elements. However, in the context of the present invention, sulfides, selenides, and tellurides, rather than oxides, are preferably used chalcogenides. As solid-state materials these preferably exhibit a good compromise between ionic and covalent binding forces and therefore are preferably suitable to contribute a surfactant function to the van-der-Waals functional layer, either as the main constituent or as an additive. Chalcogenides of Ga, In, Cd, Hg, Sn, Zn, As, or Ge are preferred electropositive elements.

In one embodiment the substrate is a silicon substrate, e.g., a Si(001) substrate. This kind of substrate is advantageously ready to be implemented in contemporary electronic and semiconductor device production methods in the scope of CMOS or the like technology. However, there is no restriction to using a (001) surface.

Another useful substrate material is mica. For mica itself provides the properties of a van-der-Waals functional layer, and thus forms an example of the case, in which the substrate itself forms the van-der-Waals functional layer without requiring a separate layer deposition.

According to the present invention, graphene growth is established by a surface step contour formed to convey a seeding that starts the growth of the graphene layer. The surface step contour in principle can be provided by any means suitable to elevate a second surface in a second halfspace from a first surface in a first halfspace of the surface. In a vertical direction (perpendicular to a plane of a main substrate surface) distance between the first and (elevated) second surface may be bridged by a step contour section that has a plane vertical, zigzag, stepped, or other profile of any preferred gradient.

The surface step contour provides a seed location where the growth of the graphene layer seeds. A seed site is understood to be a nucleation site for growth of grapheme. In other words the surface step contour is used as a nucleation means for growth of the graphene layer.

A preferred surface step contour has a kink site. A kink forms the border of a vertical step surface and a lateral step surface. The kink site of an advantageous surface step contour forms a lower border that is at the same level as the first (lower) surface in the first halfspace. This has the advantage that the graphene layer directly grows on the bottom of the step contour, i.e., directly on the van-der-Waals functional layer in the first half-space.

In other embodiments, an upper kink-site of the step contour functions as a seed site. In this type of embodiment, the seeded graphene layer can continue its growth on the elevated level of the step contour, i.e. directly on the van-der-Waals functional layer on the elevated second surface in the second half-space.

Geometrically a kink site can be zero-dimensional, that is, a location point, but also one-dimensional, i.e., a kink line. Other geometrically extended structures may be used as well. It should be noted that similar considerations apply to the step contour. The step may be arranged at an nanostructure, having an island-type or wire-type shape, or an island-type or stripe-shaped microstructure corresponding to a mesa having a larger surface area.

However, it should be noted that it is not required to provide a kink site. A flat surface of the step contour may function as a seed site in other embodiments. This is in particular the case when using a comparatively low step height, e.g., in the mono- or few-atomic layer range.

The surface step contour for instance can be formed on the substrate, that is, before the van-der-Waals functional layer is applied to the substrate. In that case, a conformal deposition of the van-der-Waals functional layer is preferred. This way, the surface step contour is maintained and present also on the van-der-Waals functional layer. Examples for forming a surface step contour comprise etching a corresponding pattern into the substrate surface, for instance in a masked etching step. The surface step contour may for example take the form of a trench. However, a masked layer deposition is also suited to create the surface step contour.

As an alternative, the surface step contour may be formed by the van-der-Waals functional layer itself or on the van-der-Waals functional layer.

In one embodiment a step height of the surface step contour closely corresponds to desired thickness of the graphene layer, if applicable plus a thickness of any material layer present underneath the graphene layer and bridging the distance between the graphene layer and the substrate. In another, currently preferred embodiment, the step height of the step contour at the seed site is restricted to the range of either one or two, or at most a few lattice constants. That is, the step contour is made of a mono- or bi- or few-layer of material. Due to this preferred low step height and the surface step contour is of virtually no direct relevance to the electronic properties of the electronic component.

Embodiments of the method disclosed herein overcome the imperfections mentioned in the context of the above description of the prior art. In particular, a structured and also controllable growth of graphene on a silicon containing substrate is enabled. This can be used to provide a structured semiconductor component or device having a graphene layer in its active zone, such as for instance a transistor.

In some embodiments band gap properties of the graphene layer in the active zone are determined by way a structured and controlled growth of the graphene layer. For instance, mono- or bi-layers of graphene can be provided, which exhibit different band gap properties.

Embodiments of the method of the invention enable the fabrication of electronic components designed for high frequency performance even at increased current densities in their active zone. In particular, for such purpose graphene may be sandwiched in the vertical direction between intermediate material layers, e.g., van-der-Waals functional layers.

The graphene layer may be deposited as a sequence of laterally spaced graphene layers or a sequence of laterally spaced graphene layer stacks.

In a preferred embodiment, a contact is fabricated at a larger distance from the substrate surface than the graphene layer, but in a lateral neighboring area of the graphene layer. This way, a comparingly poor quality of graphene in the region close to the seed site can be avoided. On the other hand, the presence of defects in this region may help to produce a good electrical contact to the electrode material.

Another aspect of the invention is an electronic component, in particular a semiconductor device, e.g. a memory cell or transistor. The transistor may be in particular a FET, such as a MOSFET or a junction transistor. Preferably the graphene layer is deposited to form a layer of an active zone of the device, for instance a base layer of a junction transistor. The graphene layer may in other embodiments be deposited to form a current channel of a FET or MOS-FET.

BRIEF DESCRIPTION OF THE DRAWINGS

Further embodiments are described in the following with reference to the Figures. The drawing shows in:

FIG. 24 (A) is a schematic perspective view of the graphene field effect transistor. FIG. 24 (B) is an optical micrograph of the graphene FET. FIG. 24 (C) shows the drain current as a function of the gate voltage.

DETAILED DESCRIPTION

Within the following description, identical or similar features or features of identical or similar function are referenced with the reference label.

Figure 1:
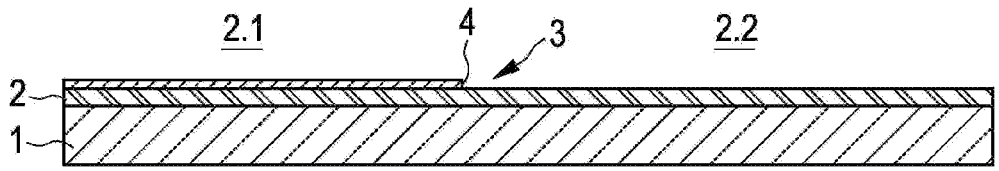
FIGS. 1 to 3 cross-sectional views of different exemplary layer structures suitable for performing a first embodiment of a method of producing a semiconductor component with a graphene layer.

FIG. 1 shows schematic cross-sectional view of a layer structure used in a first embodiment of a van-der-Waals stimulated growth process for producing a semiconductor component 100, which is shown in (iii) of FIG. 1. In a first step (i) a silicon containing a substrate 1—here formed as a Si(001) substrate—is provided. On the Si(001) substrate a van-der-Waals functional layer 2 is deposited—here formed by either $SiO_2$ or a high-K material. The van-der-Waals functional layer 2 covers a first half space 2.1 and a second half space 2.2 of the surface of the substrate 1. Between the first and second half space 2.1, 2.2 a step contour 3 is located on the surface. A kink-site 4 of the step contour 3 is formed as a vertical part thereof and mainly results from the different thickness of the van-der-Waals functional layer 2 in the first half space 2.1 on the one hand and the second half space 2.2 on the other hand. Namely, the kink site 4 is formed by the vertical step boarder between the first and second half space 2.1, 2.2. The kink-site 4 has a step-height of a few atom layers—here one atom layer.

The inventors have recognized that the provision of the van-der-Waals functional layer leads enables a physisorption of carbon clusters, unless they attach to a carbon atom that is already chemisorbed. For the example of mica, the physisorption energy was determined to be in the range 0.18 eV/atom for $C_6$ and 0.05 eV/atom for $C_{24}$, i.e., clearly larger than the contribution from pure London dispersion force (30 meV/atom). This provides that adhesion is dominated by the interaction between permanent multipoles in the van-der-Waals functional layer and multipoles induced in the molecule (van der Waals—Debye force).

In particular an oxide or a nitride or a silicide or a nitrate or a silicate of an element selected from the group of Pr, Ce. Hf, Zr, Ti, Ba, Sr, Fe, Al, Mg, K or mixtures thereof turned out to be suitable materials for the van-der-Waals functional layer. For instance, BN, $Ce_2O_3$, $CeO_2$ or $PrO_3$ or $HfO_2$ may be used.

Alkaline or alkaline earth or rare earth or transition metals or the elements mentioned above can be provided in different oxidation states. Suitable materials for the van-der-Waals functional layer include $BaHfTiO_3$, a La-Perovskite, a chalkogenide, or mixtures thereof. In another embodiment the van-der-Waals functional layer comprises $SiO_2$, $Si_3Ni_4$ or an aluminum silicate.

Figure 2:
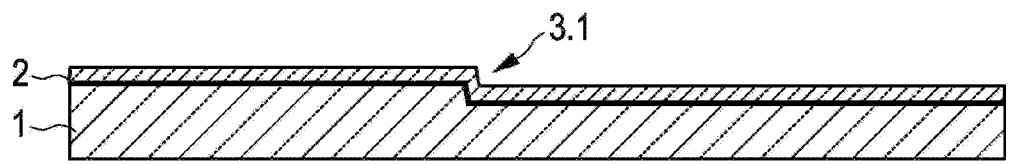
Figure 3:
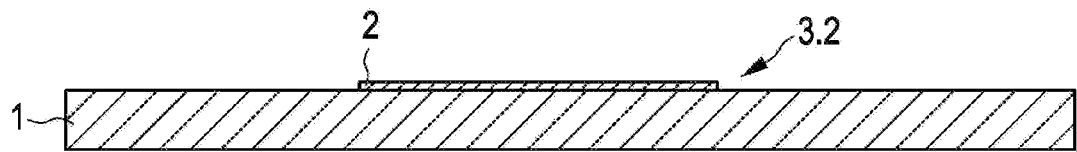

FIGS. 2 and 3 show variations of FIG. 1, which differ in the way of forming a step contour 3.1 or a step contour 3.2. In the variation of FIG. 2 the step contour 3.1 is formed by a silicon substrate 1. The deposition of the van-der-Waals functional layer 2 is done using a conformal deposition technique that maintains the surface step contour 3.1 of the silicon substrate 1. The thickness of the van-der-Waals functional layer 2 is basically of the same value all across the step-contour 3.1. This varied embodiment can be achieved for instance by providing a structured silicon wafer or the like.

In a preferred embodiment an array of steps may be produced by using a misoriented Si(001) surface followed by patterning, which involves a an etching the exposed areas.

For example, misorientation by 0.5° leads to monoatomic steps (of approximately 0.135 nm height) separated by a lateral distance of 15.4 nm. Applying a directional etch over a length of 100 nm leads to a single multi-atomic step of approximately 0.87 nm height, which can be used for seeding graphene growth. On the other hand, seeding of a graphene layer does not take place on the van-der-Waals functional layer 2 in sections grown on non-prepared areas of the substrate surface, because these non-prepared areas.

FIG. 3 shows a structured silicon substrate 1, which as such provides a van-der-Waals functional layer without requiring its deposition. The substrate is made of mica. In this case the a surface step contour 3.2 of the mica substrate 1 can be formed by known processing steps. This does not exclude the option to deposit a separate further van-der-Waals functional layer 2 on the substrate 1

Figure 4:
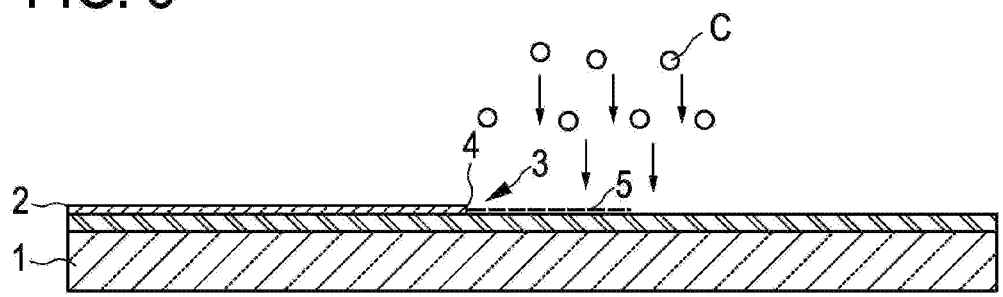
FIG. 4 the layer structure of FIG. 1 during a van-der-Waals (vdW) stimulated growth process.

FIG. 4 refers back to the exemplary layer structure of FIG. 1 and shows the layer structure during the process of growing graphene. A van-der-Waals stimulated growth process of graphene is achieved on the van-der-Waals functional layer 2 at the kink 4 of the step contour 3, which acts as a seed line for growth of a graphene layer 5. The graphene layer is deposited by direct deposition of carbon atoms C from the vapor phase. The growth on the layer structures of FIGS. 2 and 3 is performed in a corresponding manner.

Figure 5:
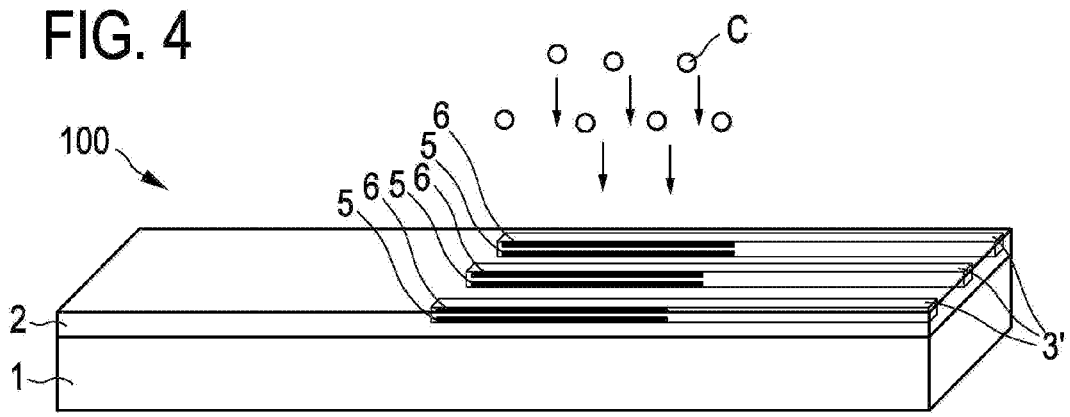
FIG. 5 an alternative embodiment comprising the provision of a vdW layer on Si(001) substrate, the vdW layer is structured to exhibit trenches and growth of a graphene ribbon is performed within the trenches.

FIG. 5 shows an alternative embodiment comprising the provision of a vdW layer on Si(001) substrate. The vdW layer 2 is structured to exhibit trenches 3' and growth of graphene ribbons 5 is performed within the trenches 3'. By forming a nano ribbon, the band structure of graphene is modified to exhibit a band gap. This allows providing a transistor structure enabling switching. Multiple graphene ribbons may be used allowing higher carrier current and averaging the fluctuation present in a single ribbon. As also shown in FIG. 5, a stack of graphene layers here a first graphene layer 5 and second layer 6 of graphene may be grown. This option will be explained in more detail further below.

Thus, as shown in FIG. 5, the step contour can be part of a sequence of laterally spaced surface step contours. Each surface step contour for instance can be provided by a stripe or a trench or a similar formation of material, which has an open face to the second half-space 2.2. Each surface step contour provides a seed for growth of a graphene layer 5, for instance at a kink site 4. Due to the sequence of separated kink sites 4, also a sequence of graphene layers 5 in form of ribbons are provided—aligned to each other and spaced apart laterally.

Figure 6:
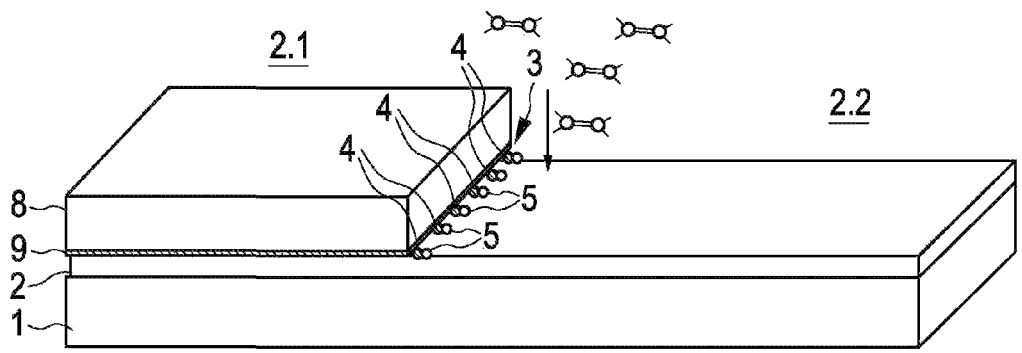
FIG. 6 a perspective view of a layer structure used in a second embodiment of a method of producing a semiconductor component using a catalytic stimulated process.

FIG. 6 shows another embodiment of the method of the invention. FIG. 6 is a perspective view of a layer structure used for enabling a catalytic stimulated process. A Si(001) substrate 1. A van-der-Waals functional layer 2 is deposited on the substrate 1. To form a surface step contour a thin metal layer 9 is first deposited on the van-der-Waals functional layer at least in the first half space 2.1. A suitable example of a metal to be used in metal layer 9 is copper (Cu). This allows achieving a step contour of low step height. The metal layer 9 here is capped by a high-K material layer 8.

The metal layer 9 is structured in form of stripes. Consequently, a sequence of kink sites 4 resulting from a sequence of step contours 3 due to the stripes is provided. Thus, the structured metal layer 9 serves as a seed layer. Each kink site 4 is used as for seeding growth of a graphene ribbon 5. The graphene ribbons 5 are formed by a deposition of carbon atoms C from a $C_2H_4$ precursor. The metal at the point-like kink sites 4 here also acts as a catalyst for cracking $C_2H_4$ to provide elementary carbon.

Figure 7:
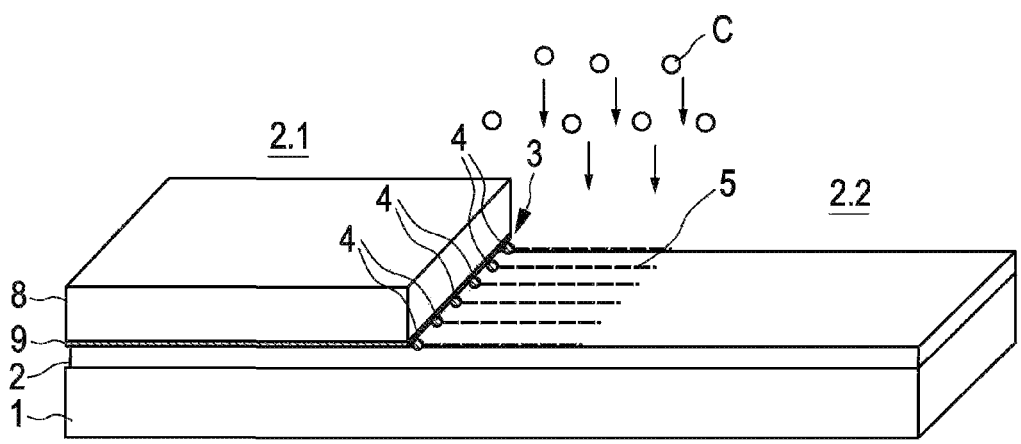
FIG. 7 a perspective view of a layer structure used in an embodiment similar to that of FIG. 6, but employing direct deposition of C-atoms.

FIG. 7 shows a similar perspective view of a layer structure used in an embodiment similar to that of FIG. 6, but employing direct deposition of C-atoms. Due to the formation of the metal layer 9 as a sequence of metal stripes to form a seed layer, growth of a sequence of graphene layers 5 is seeded at each kink site 4. The kink sites 4 of the metal layer 9 acts as a seed for elementary carbon atoms C, which are directly deposited from the vapor phase.

The lateral sequence of ribbon-shaped graphene layers 5 may be allowed to coalesce, depending on their lateral distance.

Figure 8:
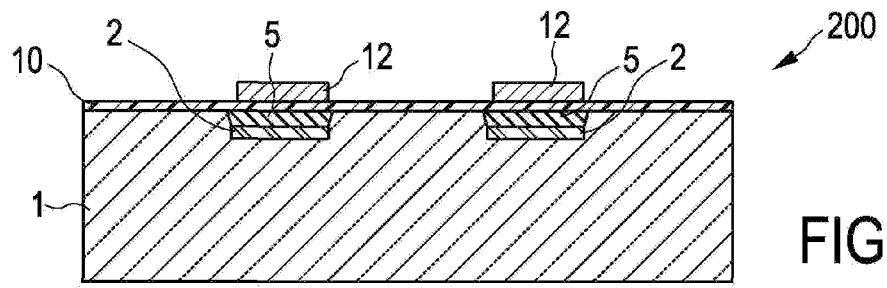
FIG. 8 a cross-sectional view of an exemplary semiconductor component in the form of a junction transistor structure.

FIG. 8 shows a junction transistor structure, which can be formed from a sequence of graphene ribbons as illustrated above. A silicon emitter is formed in a doped region (not shown) of the silicon containing substrate 1. A graphene layer 5 on a van-der-Waals functional layer 2 forms a base layer. The transistor structure is completed by capping with an insulator layer 10 and a collector 12. The insulating vdW layers 2 have a thickness between 1 and 5 nm. The arrangement of the collector and emitter may be interchanged.

Figure 9:
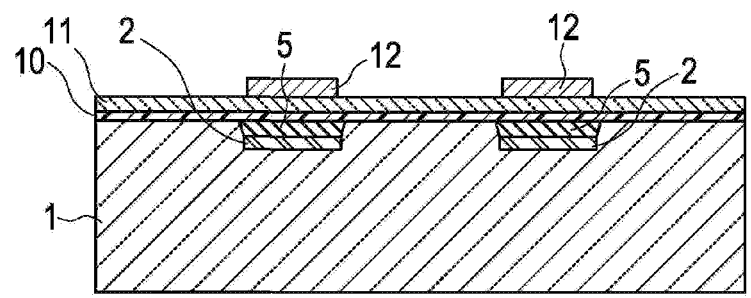
FIG. 9 an embodiment similar to that of FIG. 8, but with an additional doped silicon layer.

FIG. 9 shows an embodiment similar to that of FIG. 8, but with a doped silicon layer 11 between the insulator layer 10 and metal contacts 12. The doped silicon layer 11 improves the charge distribution in the transistor structure.

Figure 10:
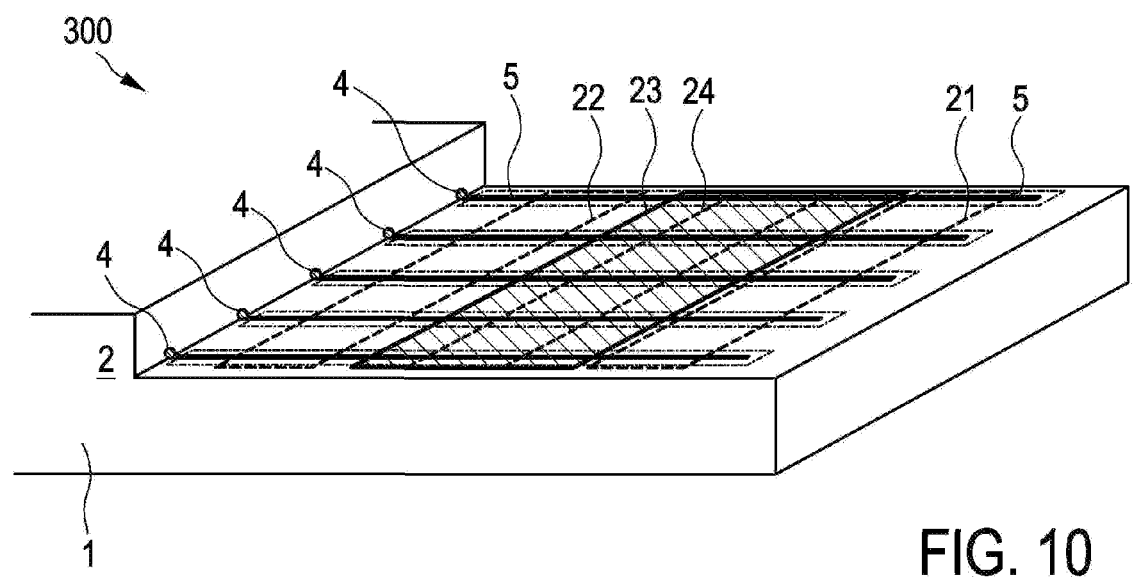
FIG. 10 a perspective view of a graphene MOSFET structure.

FIG. 10 shows a perspective view of a graphene MOSFET structure 300. Conducting channels are provided by a graphene layer 5. A sequence of graphene layers 5 is formed to provide coalescent graphene ribbons. The graphene ribbons may be produced according to a method described with respect to any one of the previous embodiments. The sequence of graphene ribbons is covered by source and drain contacts 21, 22 and, a thin gate oxide 23. A gate contact 24 is provided on top of the gate oxide 23.

Figure 11:
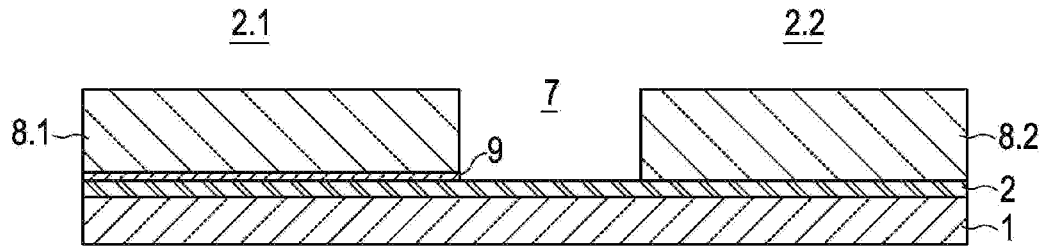
FIGS. 11 and 12 a cross-sectional view of a further embodiment of a method of producing a semiconductor component with formation of a graphene layer from two sides (A) in a trench to form a semiconductor transistor device.
Figure 12:
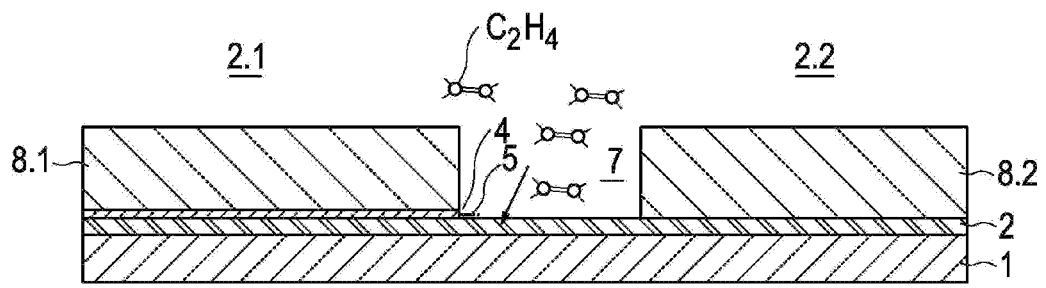

FIGS. 11 and 12 show a further embodiment of a method of producing a semiconductor component, comprising a formation of a graphene layer from onesides in a trench to form a semiconductor transistor device. In a first process sequence shown in FIG. 11, a silicon containing substrate 1 is provided and a van-der-Waals functional layer 2 is deposited thereon. Here, the van-der-Waals functional layer 2 is formed by a mixture of van-der-Waals forces expediting material and $SiO_2$ and $Si_3N_4$. In this embodiment, only in the first half space 2.1 a seed layer 9 is deposited on the van-der-Waals functional layer 2 and capped by a high-K material layer 8.1. Also in the second half space 2.2 a respective area of the van-der-Waals functional layer 2 is capped by a high-K material layer 8.2, but no seed layer is present there between. Between the cap forming high-K material layers 8.1 and 8.2 a trench 7 is provided. A bottom of the well is intended to form an active zone of the semiconductor component 400.

In a subsequent processing step shown in FIG. 12, a catalytic stimulated growth process using the copper Cu metal of the seed layer 9 as a catalysator in combination with a $C_2H_4$ precursor results in the growth of a graphene layer 5, as already described above. The seed layer 9 forms a surface step contour 3 of small height, e.g., one or two atomic layers. The thickness of the seed layer 9 is low so that only a monolayer of graphene grows in the trench 7.

Figure 13:
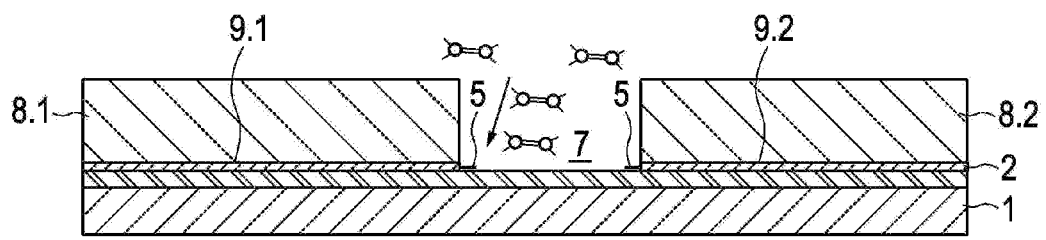
FIGS. 13 and 14 a cross-sectional view of two different variants of the embodiment of FIGS. 11 and 12.

FIG. 13 shows a variation of the process of FIGS. 11 and 12, in which a first metal layer 9.1 and a second metal layer 9.2 are deposited in the first half space 2.1 and the second half space 2.2, respectively, on the van-der-Waals functional layer 2. During a catalytic stimulated growth process as described above the graphene layer 5 grows from both sides and will coalesce and therefore achieve faster coverage of the full extension of the trench 7.

Figure 14:
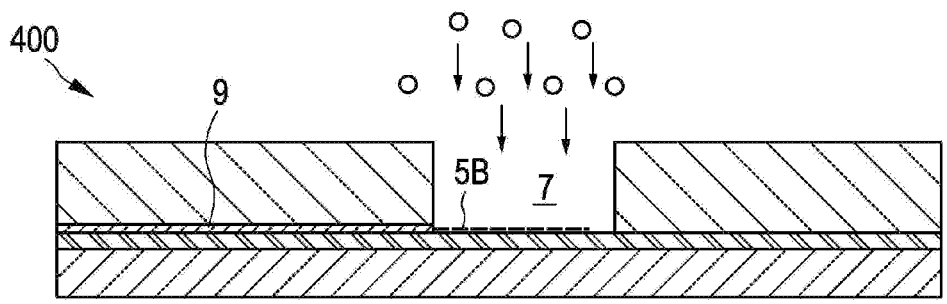

FIG. 14 shows another process variant, in which a direct deposition of carbon atoms from the vapor phase is used.

Figure 15:
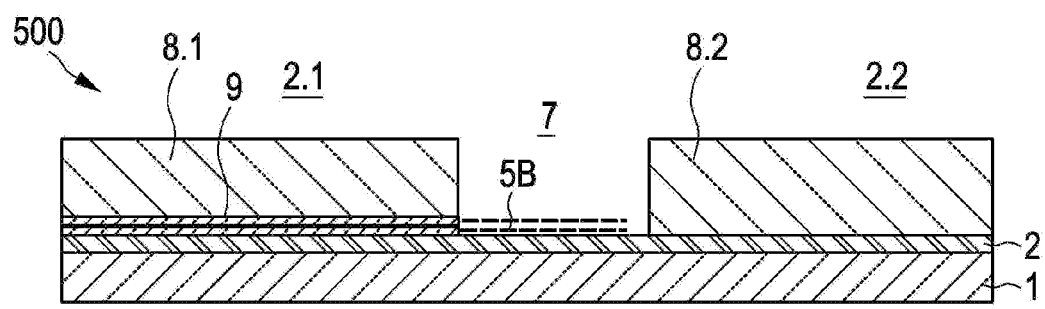
FIGS. 15 and 16 a cross-sectional view of a further embodiment of a method for producing a semiconductor component with formation of a graphene layer in a trench either as one or two or more graphene layers.
Figure 16:
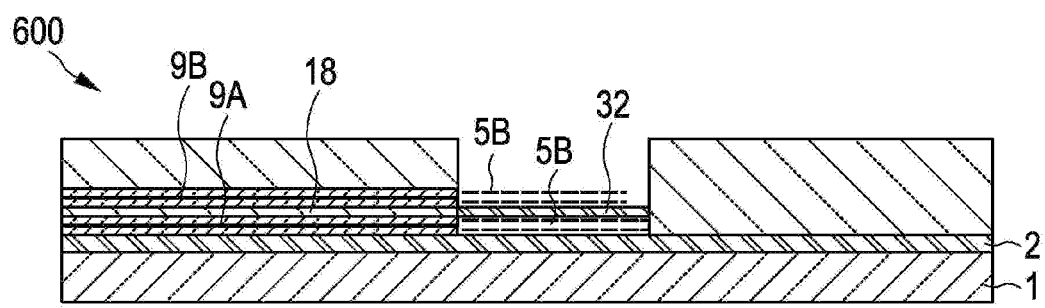

FIGS. 15 and 16 show a further embodiment of a method for producing a semiconductor component with formation of a graphene layer in a trench either as one or two or more graphene layers in principle, the structure of the semiconductor component 500, 600 in FIGS. 15 and 16 corresponds to that of the embodiments of FIGS. 11 and 12. A Si(001) substrate and a van-der-Waals functional layer 2 is deposited thereon are provided. In the first half space 2.1, a Cu metal layer 9 is provided as a seed layer. In both half spaces 2.1 and 2.2 a high-K material layer 8.1, 8.2 is deposited as a cap.

In the present embodiment, the thickness of the seed layer 9 is used to predetermine the number of graphene layers to be grown in the trench or well 7. The thickness of the seed layer 9 is such that a bilayer 5B of graphene is grown. This generates a band gap in the bilayer 5B of graphene.

In variant of FIG. 16, a stacked sequence of seed layers 9A, 9B is provided. The seed layers 9A, 9B are separated in vertical direction from each other by a intermediate layer 18 of high-K material. The thickness of each of the seed layers 9 is of such magnitude that from each seed layer 9A, 9B a bilayer 5B of graphene can be grown. The bilayers 5B of graphene are separated by an intermediate van-der-Waals functional layer 32.

Figure 17:
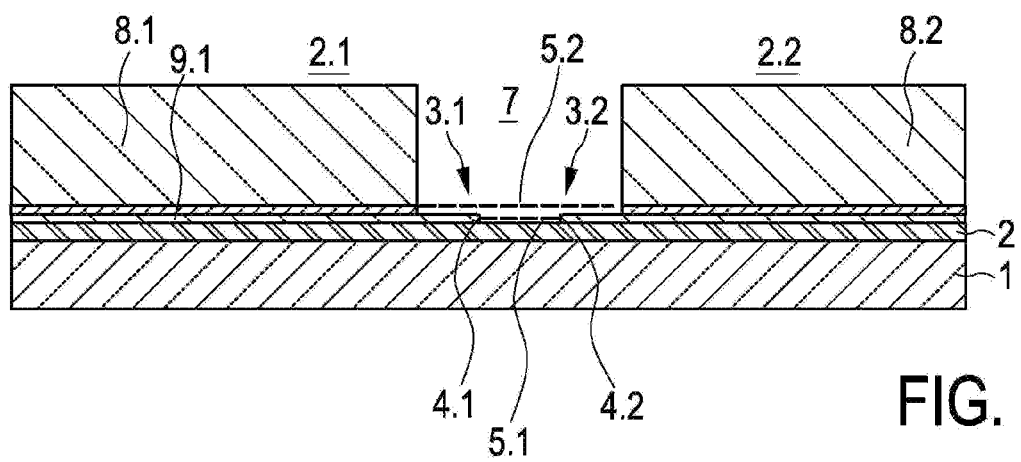
FIGS. 17 and 18 a cross-sectional view of a further embodiment of a semiconductor component forming a top gate bi- or trilayer graphene transistor.

FIG. 17 shows a further embodiment of a semiconductor component 700 forming a top gate bi- or trilayer graphene transistor. The semiconductor component comprises the basic structure corresponding to those already described in the context of the embodiments of FIGS. 11 to 16. However, in the present embodiment, the first and a second seed layer 9.1, 9.2 extend into the well or trench 7, that is, extend beyond the edge of the cap layers 8.1, 8.2 forming the side walls of well or trench 7. Consequently, a seeded growth of a graphene layer 5 starts from two sites to form a single graphene layer 5 in the trench or well 7. The graphene layer 5 can be provided as a monolayer or a bilayer, depending of the desired band gap to be achieved in the graphene layer 5 according to the purpose of the device. A further graphene layer 5.2 is grown directly on top of the first graphene layer 5.1 and the extensions of the seed layers 9.1, 9.2. As the extensions of the seed layers 9.1, 9.2 are of metallic material a direct growth of the further graphene layer 5.2 is possible.

Figure 18:
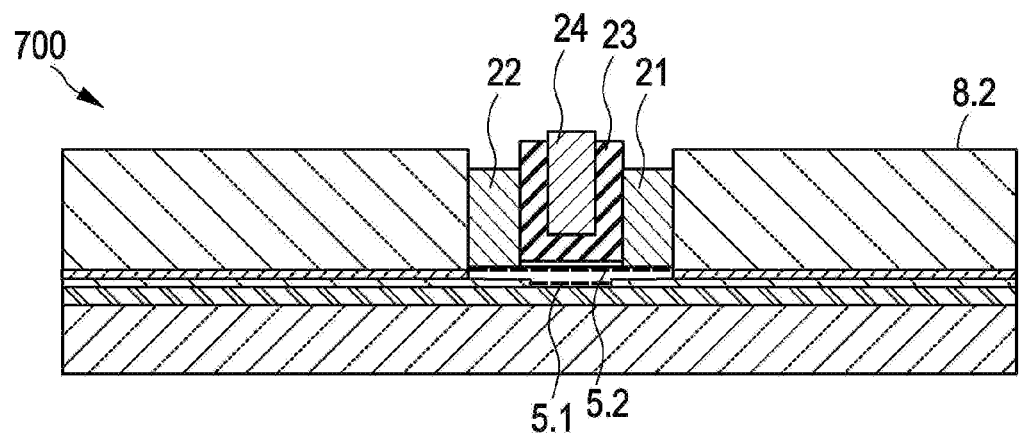

As shown FIG. 18, in a following process step sequence source and drain contacts 21, 22 as well as a gate oxide and a gate contact 23, 24 are performed on top of the two graphene layers 5.1, 5.2 in the trench or well 7. The source and drain contacts 21, 22 are connected with the second graphene layer 5.2. The first graphene layer 5.1 is isolated by the gate oxide 23 from the gate contact 24.

Figure 19:
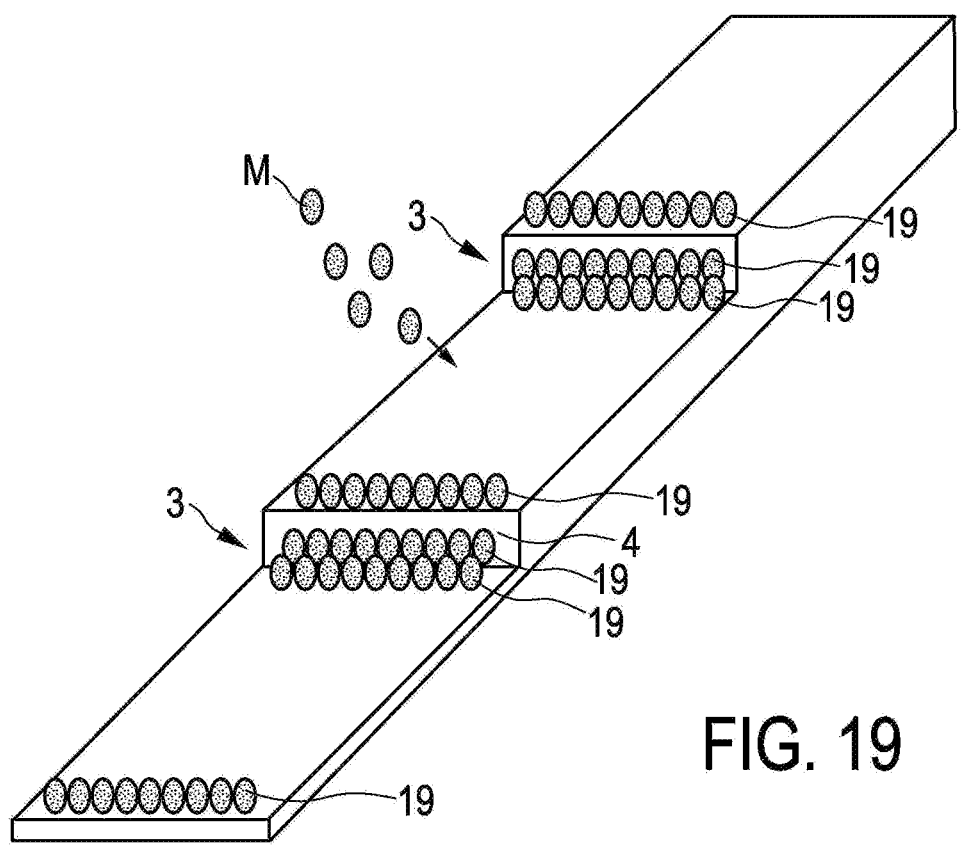
FIGS. 19 and 20 an illustration of another embodiment for growing graphene at surface step contour.
Figure 20:
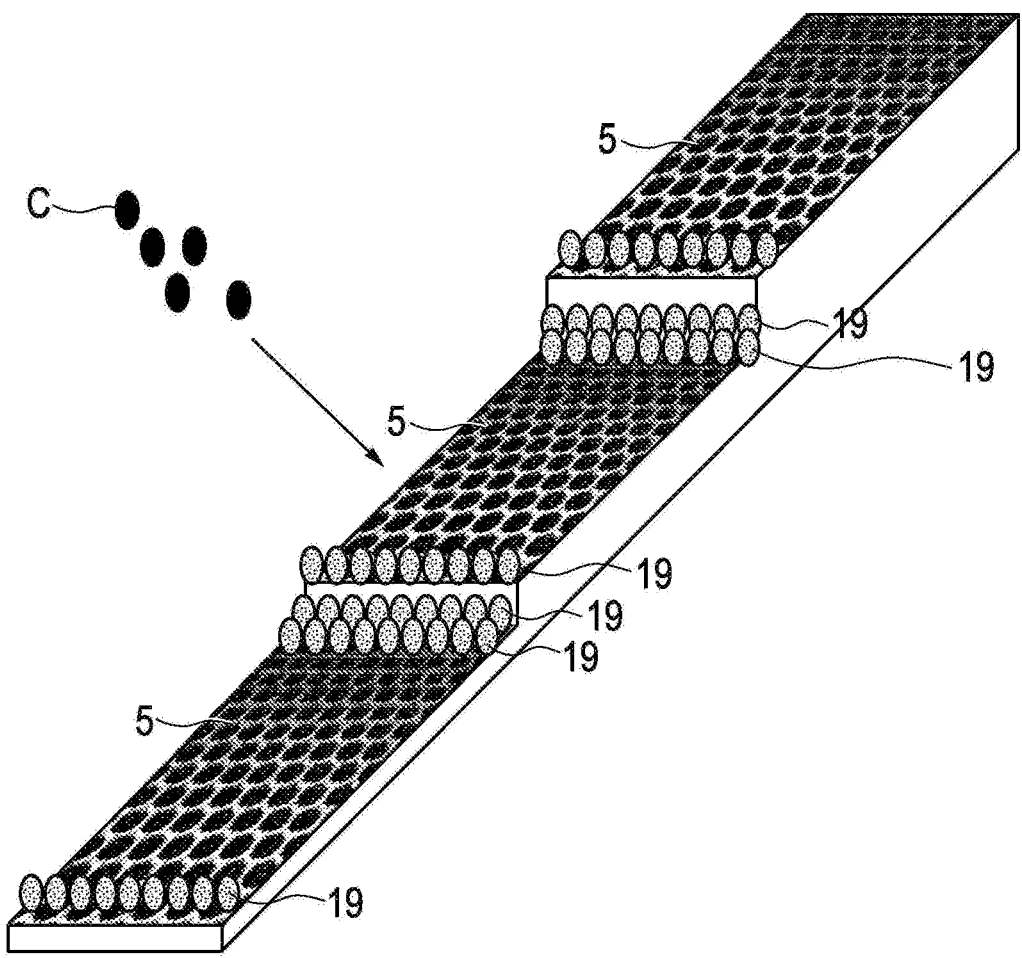

FIGS. 19 and 20 provide an illustration of another embodiment for growing graphene at surface step contour 3 formed by three consecutive insulator members with a Schwoebel-Barrier between first and second as well as second and third member. The surface step contour 3 allows an improved seeding of growth of a graphene layer 5 upon decorating it with seed atoms, suitably metal atoms M. The deposition of metal atoms M is in the present embodiment performed such that a linear arrangement 19 of metal atoms is formed either at the bottom of the surface step contour or at the top of the surface step contour, or, as also shown in FIG. 19, both at the bottom and at the top of the surface step contour. A metal-graphene contact is established during growth which is particularly suitable for self-organized growth of graphene between the different metal "lines" 19.

Figure 21:
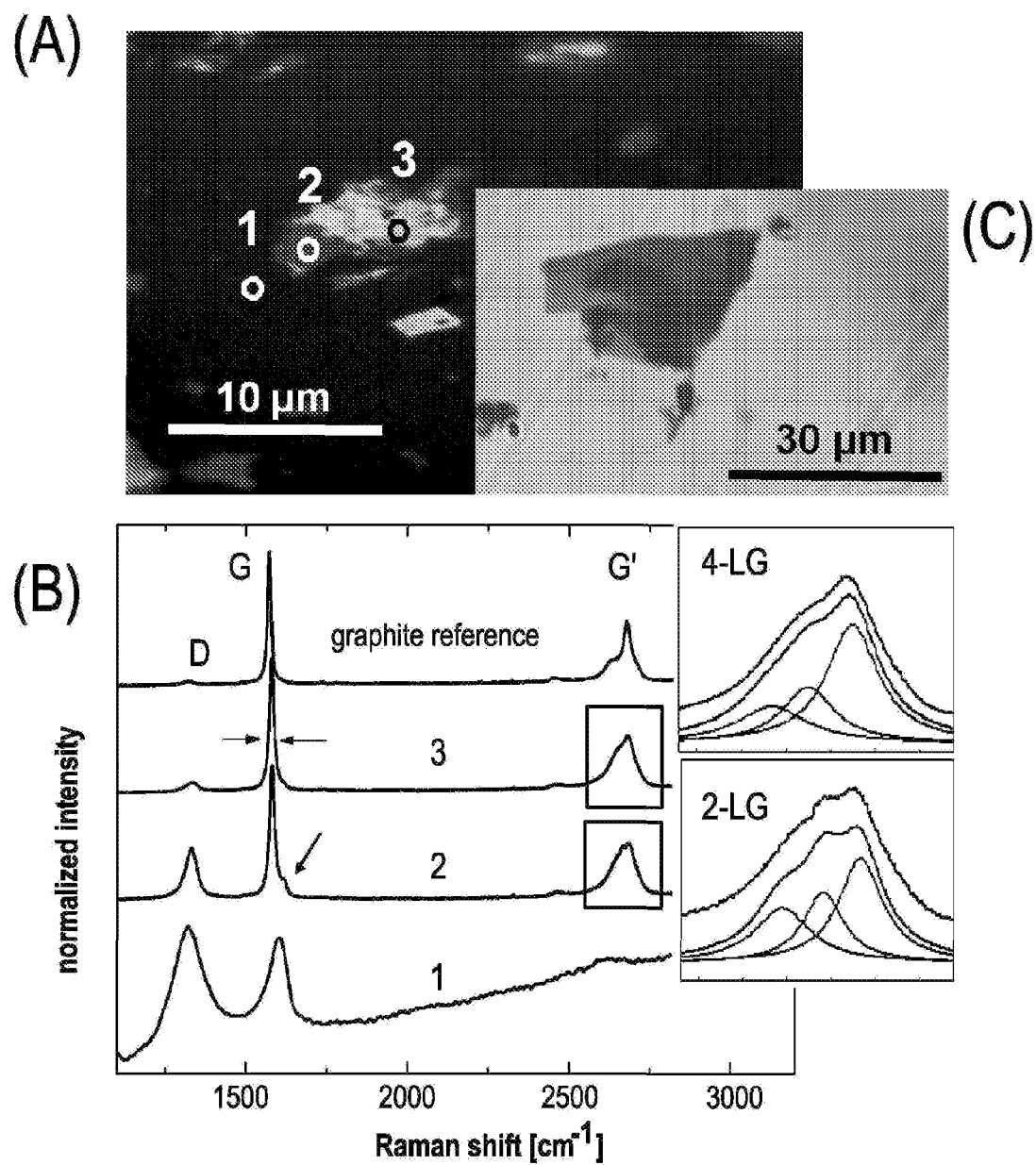
FIGS. 21 (A) and (C) optical micrographs of graphene fabricated by a direct growth using molecular beam deposition (MBD) of carbon on an insulating substrate, and FIG. 21 (B) Raman spectra taken from different positions shown in FIG. 21 (A).

In FIGS. 21 (A) and (C) show optical micrographs of graphene fabricated by a direct growth using molecular beam deposition (MBD) of carbon on an insulating substrate. FIG. 21 (B) shows Raman spectra taken from different positions shown in FIG. 21 (A).

For graphene growth mica (a layered alumina silicate) is selected as the substrate in this embodiment. Mica surfaces are among the flattest known: it is possible to prepare mica samples free of steps in areas of macroscopic scale. Layers of muscovite mica consist of three monatomic sub-layers: aluminum oxide is sandwiched between silicon dioxide. The layers are only weakly bonded, so that flat mica flakes with widely spaced steps can be obtained. When the step-step distance is selected in the micrometer range, formation of graphene with thicknesses down to two atomic layers and with a clear-cut preference for an even number of carbon layers is achieved.

Growth of graphene is enabled by providing surface step contours for nucleation and by controlling the further growth by step flow. This process is applicable in general for growth of graphene on insulators and thus, together with the demonstration of successful growth on mica, opens the way to silicon-compatible growth of device-size, device-quality graphene. It provides the basis for an electric field effect in a transistor made from a grown multilayer graphene film in FIG. 24 further below.

FIG. 21(A) shows an optical micrograph of graphene grown on a flat area of mica at 800° C.

he deposition of carbon was carried out in a DCA molecular beam epitaxy (MBE) ultra high vacuum (UHV) system on samples freshly cleaved from a sheet of muscovite mica with trigonal (3T) crystal structure, with three layers forming one unit cell. The cleaved surface is (0001) and terminated with potassium atoms. The growth rate was of the order of one monolayer per minute. The source (high-purity pyrolytic carbon) was placed 35 cm away from the sample and emitted mostly carbon atoms with weak admixture of dimers and trimers. The substrate temperature was varied between room temperature and 1100° C. and the growth time between 50 s and 600 s. The growth pressure was in the range of $10^{-7}$ mbar. The thickness and quality of the graphene film was observed ex-situ by μ-Raman spectroscopy with a spatial resolution of 0.4 μm and a spectral resolution below 2 $cm^{-1}$.

The micrograph was taken using only circularly polarized light. Three different regions can be distinguished: (1) background, (2) low contrast and (3) high contrast.

Raman spectra taken in each of these three areas are qualitatively different, as shown in FIG. 21(B). In the insets, the number of graphene layers in area 2 and 3 are determined by a spectral line-shape analysis illustrated by the resulting deconvolution into the corresponding number of individual lines. The weak bump around ~2450 $cm^{-1}$ is known as G* and appears in materials of graphene type; it bears no significant additional information. As reference, the Raman spectrum of high quality graphite is shown. The spectrum in region 1 is typical for highly reduced graphene oxide (HRGO); this chemical assignment was also verified with X-ray photoelectron spectroscopy. Such signal was found on more than 80% of the surface and can be detected already in the earliest stages of growth. Signals from regions 2 and 3 show well known G (1572 $cm^{-1}$) and G' lines (2670 $cm^{-1}$), indicative for the presence of graphene. An interaction of grown graphene with the substrate slightly modifies the Raman line shapes. The G' line spectra from region 2 and 3 are indicative of two- and four-layer graphene. In general, on muscovite substrates a clear preference towards the formation of graphene with an even number of carbon layers is found.

For the two- and four-layer case, the G line width is remarkably narrow: with about 14 $cm^{-1}$ it is nearly as small as observed in highly oriented pyrolytic graphene (HOPG) or natural graphite (cf. FIG. 21 (B), uppermost spectrum labeled "graphite reference").

Moreover, the G line is shifted with respect to graphite by ~3-5 $cm^{-1}$ towards higher wave numbers, indicating that charged impurities—like oxygen atoms—are present. In addition, the G line width is larger than expected for perfect charge carrier spatial uniformity inside the graphene (~2 $cm^{-1}$), indicating that at least regions with the size of the Raman spot (0.4 μm) exhibit p-type doping.

For further analysis, the D (distortion) line at 1330 $cm^{-1}$ of the Raman spectra was used, which originates from defects in graphene. The intensity ratio of the D and G band IG/ID is a measure of graphene quality. From the formula $$L_a = A\lambda^4 \frac{I_G}{I_D}$$

where $L_a$ denotes the crystallite size, $\lambda$ is the wavelength of the exciting laser, and A is a prefactor equal to $2.4 \times 10^{10}$ nm$^{-3}$, we estimated $L_a$ as 20 nm (HRGO, region 1), 50 nm (bilayer graphene, region 2) and 450 nm (4 layers, region 3) in diameter. (For comparison, crystallites in the graphite reference for HOPG exhibit grain sizes of about 1000 nm). This illustrates that graphene quality increases with thickness.

FIG. 21(C) shows a graphene flake grown at a higher temperature (900° C.). Changes in the optical contrast clearly reveal that the flake has terraces. Graphene forming these terraces has four to eight carbon layers (two to four bi-layers).

Figure 22:
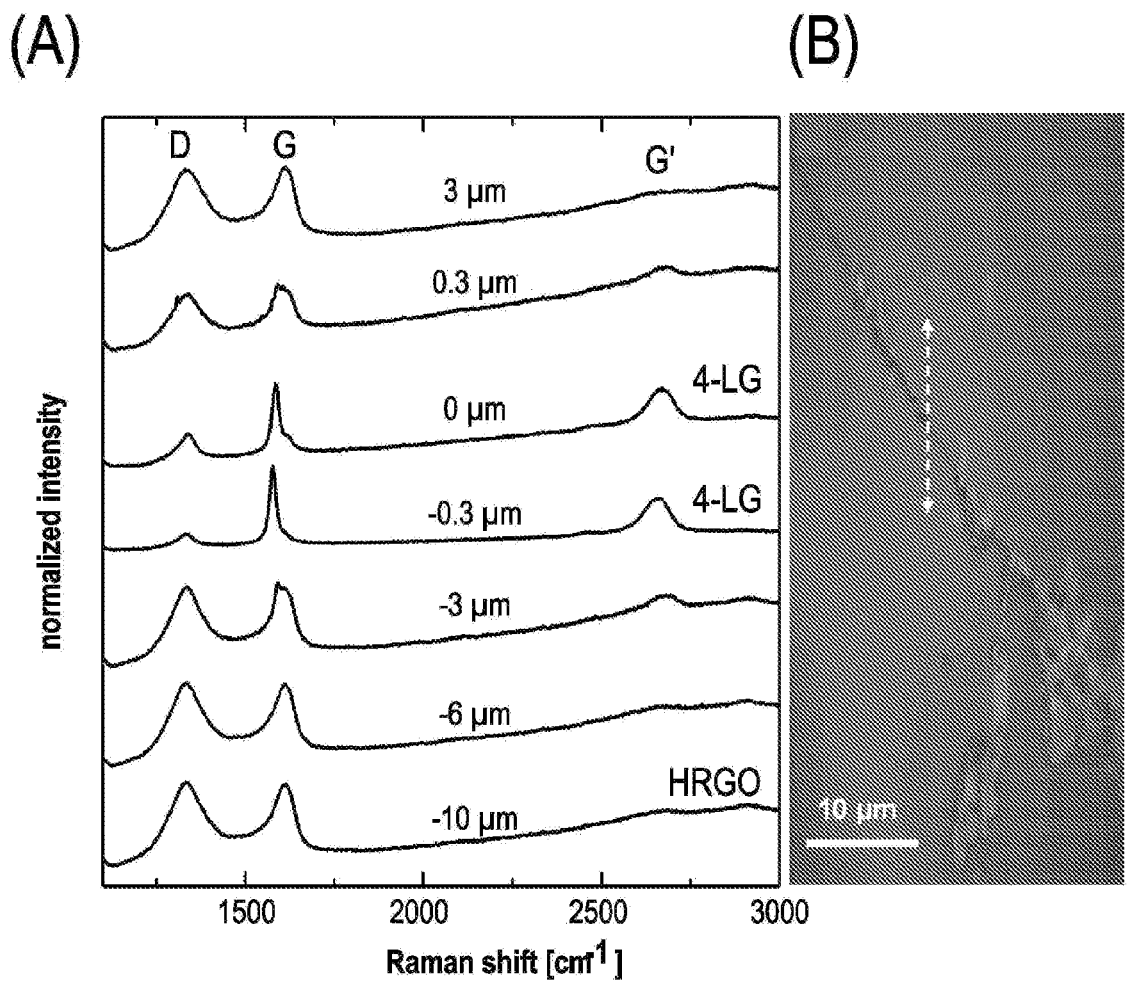
FIG. 22(A) Raman spectra taken in surface areas of a step contour on a mica substrate, the step contour being shown in a micrograph in FIG. 22(B), FIG. 23 a graph showing the influence of the substrate temperature on the graphene growth.

FIG. 22(A) shows Raman spectra taken in surface areas of a step contour on a mica substrate, the step contour being shown in a micrograph in FIG. 22(B), Graphene growth can be seeded in the vicinity of a linear crystallographic defect, which acts as a particular easily detectable surface step contour. The defect analyzed in FIG. 9 is a step of mesoscopic height (of the order of 50 nm). Such steps form occasionally when mica flakes are split off from the mica crystal. A set of Raman spectra was taken across graphene extending from the step, FIG. 22(A). The scan line is indicated by a white double-arrow in the optical micrograph in FIG. 22 (B). The spectrum changes with the distance to the step. Far from the edge, the typical HRGO signal is detected. Starting from the spatial position at about –3 µm, a contribution from graphene can be recognized: a sharp feature emerges on the low-energy side of the broad G line and a peak starts to grow at the G' energy. At –0.3 µm, the G and G' lines are characteristic for thin layer graphene. Simultaneously, the intensity of the distortion peak D at 1330 cm$^{-1}$ decreases. Directly at the edge, the intensity of D increases again, most probably caused by imperfect initial growth of graphene at the edges of mica. At the opposite side of the step, the contribution from distortions increases and eventually evolves into the HRGO spectrum again (0.3 µm and further away).

When graphene growth starts from seeds at a step and step flow dominates, island-island boundaries become less frequent. The growth front is nearly straight, as it would be for a huge island, meaning that it has the tendency to swallow the tiny islands it meets on its way: when the island is consumed and spread along the existing coast, the energy is reduced because the total length of the edge is strongly reduced (Oswald ripening). Macroscopic flakes are formed in this way. Their defects are mostly due to the fact that the growing front has to make its way through the archipelago of immobilized islands: where the front has not enough time to consume the island, coalescence defects typical for heterogeneous growth are produced. Raman signature of graphene is found in regions formed by step flow growth, reflecting a lower concentration of defects caused by the coalescence of flakes.

Step flow can explain the preference for films with an even number of layers. Indeed, the height of a muscovite monostep (0.7-0.8 nm) corresponds roughly to the distance between the carbon layers in bi-layer graphene (0.34 nm) plus the distance between graphene and the surface of mica (0.3-0.5 nm). A graphene bi-layer can be attached to the step through chemical bonds with carbon atoms substituting some of the oxygen atoms from the edge of the broken alumina silicate layer forming the step.

This even-numbered pattern is not a general feature but is associated with particular properties of muscovite steps. The energy gap of bi-layer graphene can be controlled by gate voltage.

Figure 23:
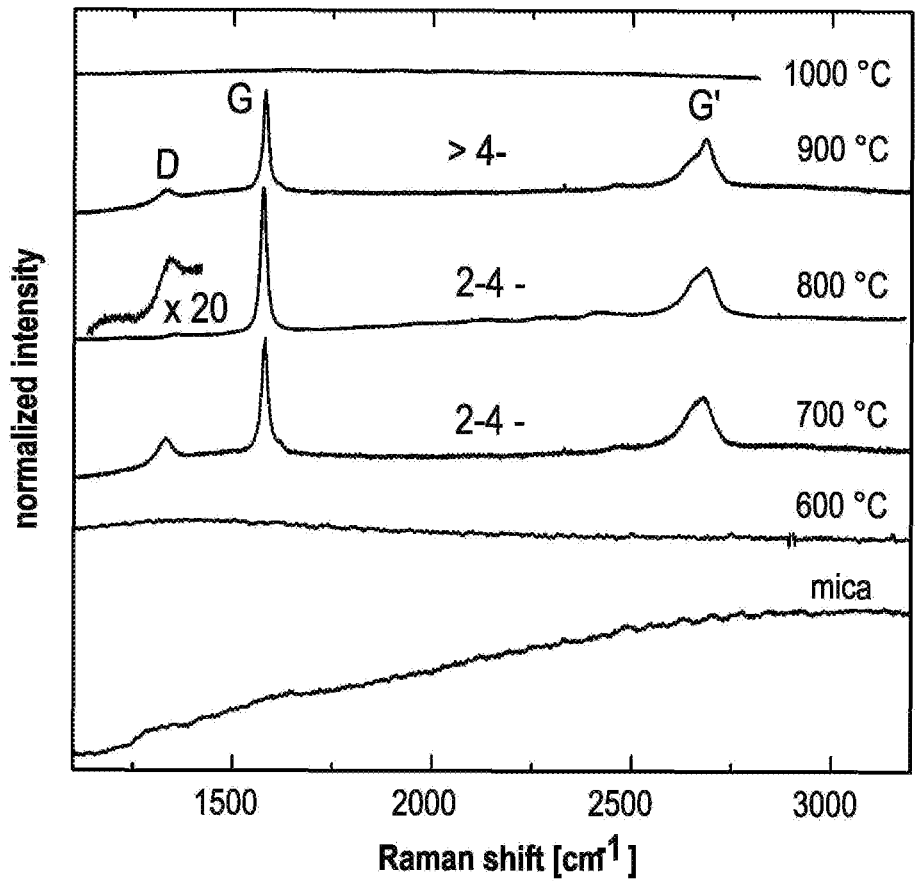

In FIG. 23 the influence of the substrate temperature on the graphene growth is demonstrated. In FIG. 23 Raman spectra selected from scans taken over several hundreds of micrometers are plotted. The plot shows those, which are representative for the lowest ID/IG ratio, i.e. the lowest defect density and the largest crystallite sizes. The highest quality graphene was obtained for growth at 800° C., with crystallite sizes estimated above 1000 nm. No graphene is detectable at 600° C. or at 1000° C. At intermediate temperatures (700° C. and 900° C.) the defect-related D peak is much stronger than at 800° C. Furthermore, the thickness of the graphene seems to correlate with the growth temperature: for 700° C. and 800° C. the G' line indicates 2-4 layers whereas for 900° C. the Raman signal shows the fingerprint of graphene with a thickness of above 4 layers.

This behavior is a result of two competing processes. At higher temperature more of the small graphene crystallites detach from their docking points on the flat surface. They can readily diffuse across the surface. This diffusion allows finding the best place for attachment, leading to a more coherent growth process. At the same time, increased temperature leads to a deterioration of the mica substrate, adding to the defect density. This can be observed also by optical inspection of mica flakes heated to 1000° C. in UHV, i.e., without exposing it to carbon vapor: the genuine brown, marble optical contrast of mica changes to grey and black. The optimal growth temperature found in this example is around 800° C., which is also approved by XPS analysis.

Figure 24:
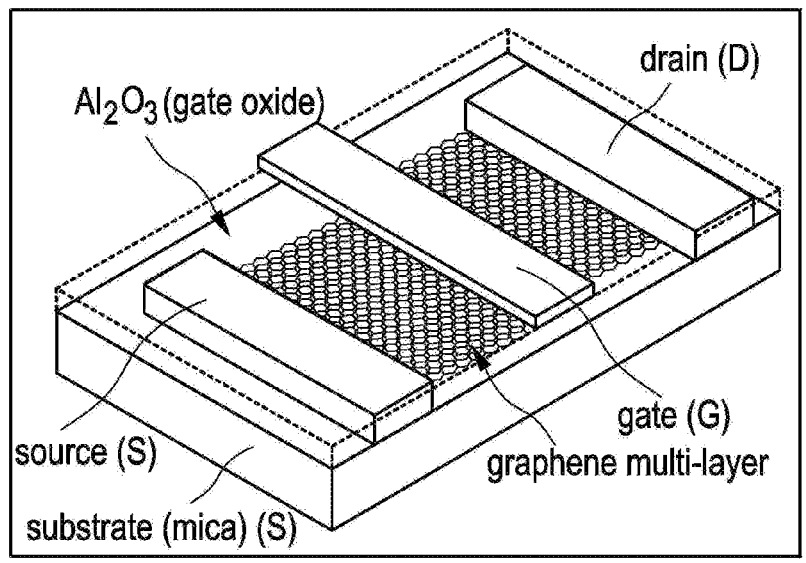
FIG. 24 comprising FIGS. 24(A) to 24(C) illustrating a field effect transistor with a graphene channel.
Figure 24:
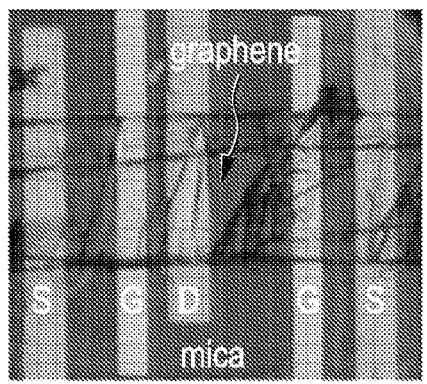
Figure 24:
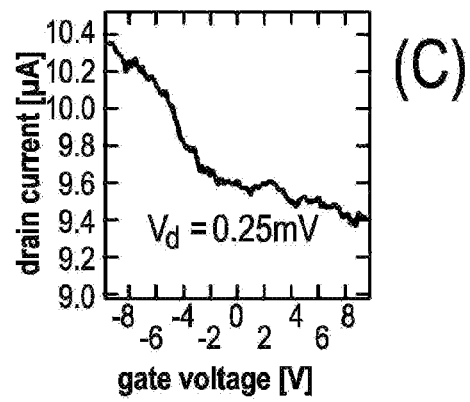

FIG. 24 shows a field effect transistor with a graphene channel. FIG. 24 (A) is a schematic perspective view of the graphene field effect transistor. FIG. 24 (B) is an optical micrograph of the graphene FET. FIG. 24 (C) shows the drain current as a function of the gate voltage ($I_d$-$V_g$ plot).

Electrical transport through a graphene field effect transistor fabricated from few-layer graphene sheets grown by MBD is demonstrated in FIG. 24. Electrical contacts to the graphene were defined by conventional electron beam lithography, followed by evaporation of titanium and gold (5 nm/40 nm). A gate insulator was grown by atomic layer deposition (ALD), where a functionalization layer based on nitrous oxide was followed by in-situ ALD of 20 nm of aluminum oxide ($Al_2O_3$) using a trimethylaluminum precursor. Finally, gate electrodes were defined by electron beam lithography and deposited by Ti/Au (5 nm/40 nm) thermal evaporation. The devices were measured in vacuum ($5 \times 10^{-3}$ mbar).

A drain bias of 0.25 mV is applied and the drain current is measured while sweeping the gate voltage from –10 to 10 V. FIG. 24(C) shows the resulting dependence of drain current on gate voltage. A clear response to the gate voltage can be observed.

LIST OF REFERENCE NUMBERS

1, 1' Silicon containing substrate, substrate in form of mica
2 van-der-Waals functional layer
2.1, 2.2 first half space, second half space
3, 3.1, 3.2 surface step contour
4, 4.1, 4.2 Kink-site
5, 5.1, 5.2 graphene layer, first graphene layer
5M monolayer
5B bilayer
6 graphene layer, second graphene layer
7 well
8 high-K material layer
8.1, 8.2 cap layers
9 seed layer, metal layer
9.1, 9.2 first and second seed layer
9A, 9B stacked sequence of seed layers
10 insulator layer
11 silicon layer
12 metal contacts 18 intermediate layer of high-K material
19 metal cable
21, 22 source and drain contacts
23 gate oxide
24 gate contact
32 intermediate van-der-Walls functional layer
300, 400, 500, 600, 700 semiconductor component
C carbon atoms
Si(001) silicon substrate

What is claimed is:

1. A method for fabricating an electronic component, comprising:
    providing a substrate and a plurality of surface step contours on the substrate; and
    depositing a van der Waals layer adjacent to the surface step contours; and
    depositing a graphene layer on the van der Waals layer; wherein
    growth of the graphene layer is seeded at a kink of the surface step contours.

2. The method according to claim 1, wherein forming the surface step-contours comprises fabricating a line-shaped or mesa-shaped seed layer on the van-der-Waals functional layer.

3. The method according to claim 2, wherein the seed layer is made of Si or a metal from the group formed by Ti, Ni, Al, and Cu.

4. The method according to claim 1, wherein providing the surface step contours comprises a depositing a plurality of seed layers, which are stacked in a vertical direction on the surface and are separated from each other by a respective intermediate dielectric layer.

5. The method according to claim 1, wherein a forming the surface step contours comprises fabricating the surface step contour to have a step-height that limits a vertical growth of the graphene layer to a monolayer or a bi-layer of graphene.

6. The method according to claim 1, wherein the substrate either contains or consists of silicon.

7. The method according to claim 1, wherein depositing the graphene layer is performed at a substrate temperature higher than 600° C. and lower than 1000° C.

8. The method according to claim 1, wherein depositing the graphene layer comprises depositing atomic Carbon (C).

9. The method according to claim 1, wherein depositing the graphene layer comprises catalytically separating Carbon atoms (C) from a Carbon-comprising compound.

10. An electronic component comprising:
    a substrate and a plurality of surface step contours on the substrate;
    a van-der-Waals layer deposited adjacent to the step contours; and,
    a graphene layer on the van der Waals layer and seeded at a kink of the step contours.

11. The electronic component according to claim 10, comprising a plurality of graphene layers, which are arranged in a lateral layer sequence or in a vertical layer stack.

12. The electronic component of claim 10, which takes the form of a memory cell or a transistor.

13. The electronic component of claim 10, wherein a line-shaped or mesa-shaped seed layer is arranged between the van-der-Waals layer and the graphene layer.

14. The electronic component of claim 10, wherein the substrate either contains or consists of silicon.

15. The electronic component of claim 10, wherein the van-der-Waals functional layer is made from the group formed by boron nitride BN and aluminum oxide $Al_2O_3$.

* * * * *

UNITED STATES PATENT AND TRADEMARK OFFICE
CERTIFICATE OF CORRECTION

PATENT NO. : 8,778,782 B2
APPLICATION NO. : 13/306031
DATED : July 15, 2014
INVENTOR(S) : Gunther Lippert et al.

It is certified that error appears in the above-identified patent and that said Letters Patent is hereby corrected as shown below:

On The Title Page, Item (73) Assignee should read
--IHP GmbH – Innovations for High Performance Microelectronics / Leibniz-Institut für Innovative Mikroelektronik--.

Signed and Sealed this
Twenty-seventh Day of January, 2015

Michelle K. Lee
*Deputy Director of the United States Patent and Trademark Office*